United States Patent
Nihonmatsu et al.

(10) Patent No.: US 6,764,392 B2
(45) Date of Patent: Jul. 20, 2004

(54) WAFER POLISHING METHOD AND WAFER POLISHING DEVICE

(75) Inventors: Takashi Nihonmatsu, Kosyoku (JP); Takahiro Kida, Kosyoku (JP); Tadao Tanaka, Kosyoku (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 128 days.

(21) Appl. No.: 09/913,790

(22) PCT Filed: Dec. 15, 2000

(86) PCT No.: PCT/JP00/08917

§ 371 (c)(1),
(2), (4) Date: Aug. 16, 2001

(87) PCT Pub. No.: WO01/47664

PCT Pub. Date: Jul. 5, 2001

(65) Prior Publication Data

US 2002/0160693 A1 Oct. 31, 2002

(30) Foreign Application Priority Data

Dec. 28, 1999 (JP) .......................................... 11-374053

(51) Int. Cl.[7] .............................................. B24B 29/00
(52) U.S. Cl. ........................ 451/289; 451/388; 451/460
(58) Field of Search ................................ 451/289, 287, 451/288, 388, 398, 6, 8, 5, 460

(56) References Cited

U.S. PATENT DOCUMENTS

| | | | | |
|---|---|---|---|---|
| 5,766,058 A | * | 6/1998 | Lee et al. | 451/41 |
| 5,975,998 A | * | 11/1999 | Olmstead | 451/288 |
| 6,077,153 A | * | 6/2000 | Fujita et al. | 451/259 |
| 6,217,417 B1 | * | 4/2001 | Nakamura et al. | 451/41 |
| 6,271,676 B1 | * | 8/2001 | Montoya | 324/765 |
| 6,368,969 B1 | * | 4/2002 | Economikos et al. | 438/690 |
| 6,402,594 B1 | * | 6/2002 | Kobayashi et al. | 451/41 |

FOREIGN PATENT DOCUMENTS

| | | |
|---|---|---|
| JP | A 64-10643 | 1/1989 |
| JP | A 1-101386 | 4/1989 |
| JP | A 7-100738 | 4/1995 |
| JP | A 8-12470 | 1/1996 |
| JP | A 11-233463 | 8/1999 |
| JP | A 11-245163 | 9/1999 |
| JP | A 11-265928 | 9/1999 |

* cited by examiner

*Primary Examiner*—Dung Van Nguyen
(74) *Attorney, Agent, or Firm*—Oliff & Berridge, PLC

(57) ABSTRACT

A polishing method and polishing apparatus capable of improving the flatness of a wafer are provided. When a wafer is adhered to a wafer holding plate for polishing a surface to be polished of the wafer by pressing and rubbing the surface to be polished against a polishing pad on a polishing turn table, the wafer is held by vacuum-chucking the surface to be polished of the wafer such that a surface to be adhered of the wafer forms a convex surface in a vicinity including an arbitrary point in the surface to be adhered within a region surrounding a center of the surface to be adhered of the wafer, and the region being at least not less than 50% of an entire adhesion area; and the wafer is adhered to the wafer holding plate from a central portion of the surface to be adhered of the wafer.

29 Claims, 6 Drawing Sheets

WAFER POLISHING METHOD AND WAFER POLISHING DEVICE

TECHNICAL FIELD

The present invention relates to a method for polishing a wafer and an apparatus for polishing a wafer, and furthermore to a wafer holding plate, a wafer adhering method and a wafer adhering apparatus that are used for the method and apparatus for polishing a wafer.

BACKGROUND ART

Reflecting increasing a diameter of a silicon wafer and improving of high accuracy of a device fabricated by employing it, the requirements for final accuracy (thickness uniformity, flatness and smoothness) of a silicon wafer (polished wafer) which is polished for finish are becoming higher.

In order to satisfy such requirements, techniques of polishing process for wafer have been improved, and apparatuses for the polishing process have been developed and improved.

As one of them, so-called single wafer polishing apparatuses have been freshly developed for the purpose of polishing a wafer having a large diameter of, particularly 300 mm or mote, and some of them are put to practical use.

However, with the single wafer polishing method, problems that (1) is difficult to meet the requirement for a reduction of wafer costs in view of productivity, (2) it is difficult to meet the recent requirement for flatness in the vicinity of peripheral edge of the wafer (within 1 mm from peripheral outer edge), or the like have arisen.

On the other hand, with a polishing method by a batch processing polishing apparatus in which a plurality of wafers are adhered to a wafer holding plate with adhesive, and then polished simultaneously, which is popularized most, the constitution and structures of the apparatus and performance thereof are being improved for achieving She high accurate finish. However, there is the following problem according to the adhesion mounting of the wafer on the wafer holding plate via adhesive.

That is, although ceramic materials have employed for the wafer holding plate, for example, with a wafer holding plate made of sintered ceramic including alumina as the main component, thickness unevenness of an adhesive layer generates in an adhesion portion. It is considered that the thickness unevenness is caused by surface roughness and fine structure of the wafer holding plate, physical property of an interface between the adhesive and the ceramic, or the like. The thickness unevenness causes unfavorable ununiformity of the thickness in the wafer after polishing.

On the other hand, with a wafer holding plate made of glass, the above-described problem of the thickness unevenness of the adhesive layer in the adhesion portion is avoided. However, when the wafer is pressed against a polishing pad during polishing, the glass bends, causing excess polishing of the peripheral portion of the wafer compared to other portions. Thus, the flatness of the wafer lowers.

Further, when the wafer is adhered to the wafer holding plate, very small amount of air remains between the wafer holding plate and the wafer. A portion of a surface to be polished of the wafer, which is corresponding to a portion sandwiching the remained air bubble, protuberates slightly, and is polished extra. As a result, the thickness unevenness of the wafer and the lowering of the flatness of the polished surface are caused.

In order to solve this problem, a jig that curves the wafer so that the air between the wafer and the wafer holding plate will be let out from the center of the wafer toward the periphery of the wafer, and that is for adhering the wafer to the wafer holding plate from the center of the wafer has been developed. However, with the jig having the previous structure, a surface to be adhered of the wafer does not become a uniform convex surface, but a part of the surface to be adhered forms a concave surface portion. Thereby, the air remains in the concave surface portion, and thus the problem is not solved completely.

Furthermore, particularly, with the wafer holding plate used for the batch processing polishing apparatus, since the wafer is adhered to the wafer holding plate at an eccentric position, even if the wafer holding plate is rotated inductively, rubbing rates vary in-plane in a single wafer against the polishing pad. Thus, the peripheral portion of the wafer is excessively polished compared to the central portion thereof. This is a factor obstructive to the improvement of the flatness of the wafer.

DISCLOSURE OF THE INVENTION

For solving the problems caused by the adhesion of the wafer described above, investigations and trial manufactures were repeatedly carried out eagerly. Then, it was achieved developing an adhering method and an adhering apparatus that let out the air between the wafer and the wafer holding plate during the adhesion by forming the surface to be adhered of the wafer into the convex surface as a whole, and then do not make an air bubble remain.

With the adhering method and the adhering apparatus, the wafer is held by vacuum-chucking the surface to be polished of a wafer such that a convex surface is formed in the vicinity including an arbitrary point within a region surrounding the center of the surface to be adhered of the wafer, and the region being at least not less than 50% of the entire adhesion area, and the wafer is adhered to the wafer holding plate from the central portion of the surface to be adhered of the wafer.

When the wafer is curved so as to form such convex surface, it is preferable that a wafer contacting region of a wafer holding surface of a contacting member has a value of radius of curvature between 5 m and 1000 m, the radius of curvature being for a line of intersection between a plane which includes a normal line of an arbitrary point and which passes through a center of the wafer contacting region and the wafer contacting region, within a region surrounding the center of the wafer contacting region and corresponding to at least not less than 50% of the entire adhesion area of the wafer. Furthermore, it is preferable that the surface to be adhered of the wafer is made such that a value of radius of curvature of a line of intersection between a plane including a normal line of an arbitrary point and passing through a center of the surface to be adhered and the surface to be adhered is between 5 m and 1000 m, within a surface which surrounds the center of the surface to be adhered and which is at least not less than 50%. The reason therefor is that when the value of radius of curvature is less than 5 m, problems that ① when the vacuum-chuck is released, because a restoring force of the wafer is large, the peripheral portion of the wafer is immediately brought into contact with the wafer holding plate, thereby the air between the wafer holding plate and the wafer is not removed sufficiently, ② excessive stress generates inside of the wafer, ③ it is required to increase the vacuum-sucking force for the wafer, or the like arise. On the other hand, the reason therefor is that when the value of the radius of curvature is more than 1000 m, there are problems that the peripheral portion of the wafer is brought into contact with the wafer holding plate before the air in the center lets out, thereby the air between the wafer holding plate and the wafer is not removed sufficiently, or the like.

As a concrete method for forming the surface to be adhered of the wafer into the above-described convex surface, the wafer holding surface itself of the contacting member chucking the surface to be polished of the wafer may be formed into the convex surface, or the contacting member chucking the surface to be polished of the wafer may be transformed by a pressure applying means such that the surface to be adhered of the wafer forms the convex surface. In the latter case, for example, an air supply and discharge apparatus is used as the pressure applying means.

On the other hand, at first, the wafer can be held by vacuum-chucking only in the peripheral portion of the surface to be polished of the wafer. In this case, it may be preferable that the wafer may be held by vacuum-chucking with a plurality of holders having sucking disk structure. When the vacuum-chuck holding is carried out with the plurality of holders, each chucked area can be reduced all the better for that. Thus, no concave surface portion generates in the surface to be adhered of the wafer.

Alternatively, holding of the wafer by vacuum-chucking may be carried out by vacuum-sucking the surface to be adhered of the wafer through a small hole for discharging air, the small hole being provided to the contacting member, or by vacuum-sucking the surface to be adhered of the wafer through a groove formed in the wafer holding surface of the contacting member.

The contacting member may be made of ceramic, polymeric material or metallic material, for example. When the metallic material is employed, at least a wafer holding surface of the contacting member is coated with nonmetallic material.

The inventors made various developments and trial manufactures for solving the thickness unevenness of the adhesive layer in the adhesion portion when the wafer is adhered to the wafer holding plate made of ceramic. The inventors developed a wafer holding plate that is capable of combining rigidity of ceramic and an excellent adhesion property of the wafer holding plate made of glass, and then achieved obtaining a high accurate polished wafer by applying a polishing method and a polishing apparatus to which these development results are adapted.

For example, a base member of the wafer holding plate is made of ceramic and a surface for adhering a wafer comprises a glass layer. Alternatively, the base member is made of ceramic and a side for adhering a wafer is provided with a glass plate. In this case, it is preferable that the glass comprises borosilicate glass. Furthermore, it is preferable that the glass layer has a thickness between 0.05 mm and 2 mm, and the glass plate has a thickness between 1 mm and 20 mm.

Further, adhering the wafer to the wafer holding plate combining the rigidity and the adhesion property by using the improved adhering method and adhering apparatus, and then polishing the wafer has a remarkable effect on improvement of the flatness of the wafer.

Furthermore, when a wafer holding portion of a wafer holding plate employed for the batch processing polishing apparatus is turnable with respect to a base body, the surface to be polished of the wafer comes more uniformly in contact with the polishing pad. Therefore, it has much effect on improvement of the flatness.

When the wafer is adhered to the wafer holding plate, it is preferable that a wafer is adhered while holding the wafer such that difference of elevation of the surface to be adhered of the wafer is between 20 μm and 1000 μm. The reason therefor is that when the difference of elevation is more than 1000 μm, problems that ① when the vacuum-chuck is released, because a restoring force of the wafer is large, the peripheral portion of the wafer is immediately brought into contact with the wafer holding plate, thereby the air between the wafer holding plate and the wafer is not removed sufficiently, ② excessive stress generates inside of the wafer, ③ it is required to increase the vacuum-sucking force for the wafer, or the like arise. On the other hand, the reason therefor is that when the difference of elevation is less than 20 μm, there are problems that the peripheral portion of the wafer is brought into contact with the wafer holding plate before the air in the center lets out, thereby the air between the wafer holding plate and the wafer is not removed sufficiently, or the like.

PREFERRED EMBODIMENT OF THE INVENTION

Figure 1:
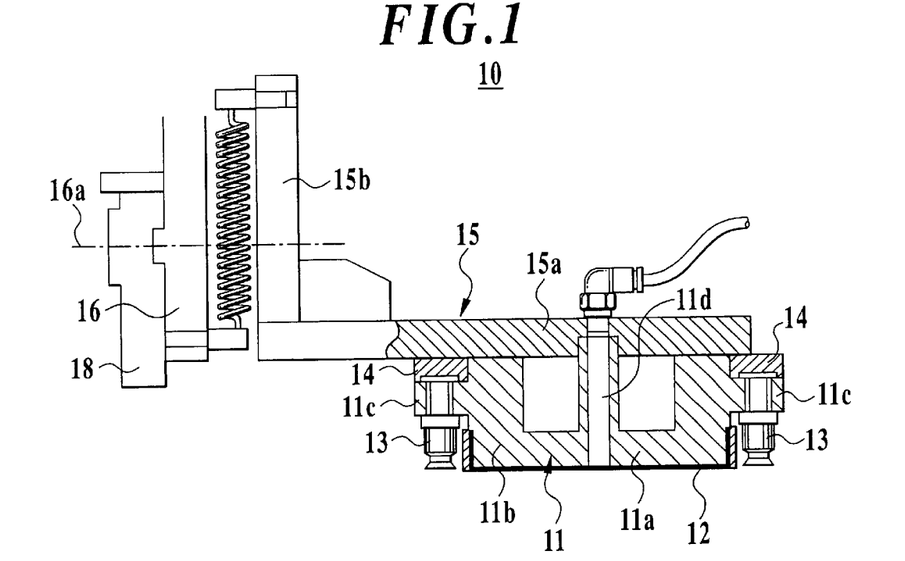
FIG. 1 is a schematic structural view of a wafer adhering apparatus according to the first embodiment of the present invention.
Figure 2:
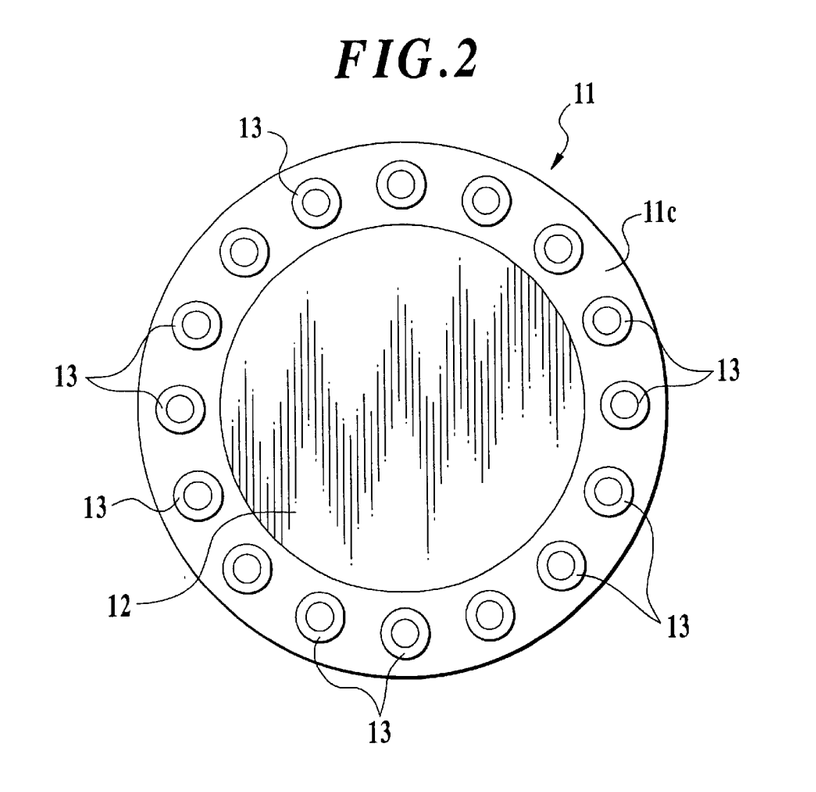
FIG. 2 is a view showing a contacting member and the vicinity thereof in the wafer adhering apparatus according to the first embodiment.

In FIG. 1, a wafer adhering apparatus according to the first embodiment of the present invention is shown. The wafer adhering apparatus 10 of the first embodiment is provided with a wafer holding member 11. A lower surface (a surface which is in a lower side in an adhering condition) of the wafer holding member 11 is shown in FIG. 2. The wafer holding member 11 has a circular shape as a whole when looked from the lower surface side. The lower surface of the wafer holding member 11 is provided with a contacting member supporting portion 11a supporting a rear surface of a body of a contacting member 12 which is brought into contact with a surface to be polished of a wafer W, and a chucking pad attachment portion 11c which projects circularly into outside of the contacting member supporting portion 11a and which is for attaching a plurality of chucking pads (holders) 13.

The contacting member 12 is, for example, made of silicone rubber. The attachment of the contacting member 12 to the wafer holding member 11 is carried out by engaging a peripheral portion of the contacting member 12 in the contacting member supporting portion 11a. The contacting member 12 may be made of ceramic, other polymeric materials or metallic materials in place of the silicon rubber. When the contacting member 12 is made of metallic material, it is preferable that the wafer holding surface is coated with nonmetallic material in order to prevent the metal contamination of the wafer.

In the contacting member supporting portion 11a, an air supply and discharge hole 11d is formed. This air supply and discharge hole 11d is communicated with an air supply and discharge apparatus (for example, a pump) which is a pressure applying means and not shown. The contacting member 12 is expanded or contracted by supplying air from the air supply and discharge apparatus to a space between the contacting member supporting portion 11a and the contacting member 12 or by discharging the air from the space. A plurality of chucking pads 13 are attached to the chucking pad attachment portion 11c. To a rear surface of the chucking pad attachment portion 11c, a ring-like member 14 having an air passage communicating with the plurality of chucking pads 13 through the chucking pad attachment portion 11c is attached. The air passage is independently communicated with an air supply and discharge apparatus.

When the wafer W is chucked by the plurality of chucking pads 13 and the contacting member 12 is expanded, the contacting member 12 curves the wafer W such that the surface to be adhered of the wafer W forms a convex surface in the vicinity including an arbitrary point in a region surrounding the center of the surface to be adhered and being at least not less than 50% of the entire adhesion area. In this case, the curving condition of the wafer W is determined by an expanded shape of the contacting member 12, a relative position between the contacting member 12 and the chucking pads 13, or the like. Thus, it is required to suitably select these. With the value of the curvature of the wafer holding surface of the contacting member 12, when the wafer has a diameter of 200 mm or 300 mm, it is preferable that a value of radius of curvature of a line of intersection between a plane including a normal line of an arbitrary point on the holding surface and passing through a center of the holding surface and the holding surface is between 5 m and 1000 m.

When the wafer W is curved in this way, the adhesion to the wafer holding plate gradually proceeds from the central side toward the peripheral portion of the surface to be adhered of the wafer W. Thus the remaining of air is efficiently prevented.

The wafer holding member 11 to which the contacting member 12 is attached is attached to an L-shaped arm 15. The L-shaped arm 15 has a horizontal portion 15a and an upright portion 15b extending in a perpendicular direction to the horizontal portion 15a. The wafer holding member 11 is attached to the horizontal portion 15a. On the other hand, the upright portion 15b of the arm 15 is attached to a turning member 16 turning on a horizontal axis 16a. The arm 15 is attached to the turning member 16 so that the arm 15 will be capable of reciprocating in one direction perpendicular to the horizontal axis 16a.

The turning member 16 is attached to an elevating member 18. The turning member 16 and the elevating member 18 are made to rise and fall as a body by an elevating means which is not shown.

The wafer adhering apparatus 10 constructed as described above receives the wafer W from a chucking apparatus which is not shown. During receiving of the wafer W, the contacting member 12 faces upward by the above-described turning means which is not shown. In this upward condition, the wafer W is vacuum-chucked by the chucking pads 13.

Thereafter, the contacting member 12 is made to face downward by the turning means, and moved near to the wafer holding plate by the elevating means which is described above and not shown. Before the approach to the wafer holding plate or after the approach, the air is supplied by the air supply and discharge apparatus through the air supply and discharge hole 11d, and the contacting member 12 expands. Thereby, the surface to be adhered of the wafer W curves such that it forms the convex surface in the vicinity including an arbitrary point in the region which surrounds the center of the surface to be adhered of the wafer and which is at least not less than 50% of the entire adhesion area. Under this condition, the central portion of the surface to be adhered of the wafer W is pressed against the wafer holding plate. The air between the contacting member supporting portion 11a and the contacting member 12 is discharged through the air supply and discharge hole 11d, and the contacting member 12 is contracted. Further the vacuum-chuck with the chucking pads 13 is released. Thereby, the wafer W is adhered to the wafer holding plate.

According to the wafer adhering apparatus 10 described above, since the wafer W is chucked to be held by the plurality of chucking pads 13, each having small chucking area, no concave surface portion generates on the surface to be adhered of the wafer W. Therefore, remaining of the trace amount of air between the surface to be adhered of the wafer W and the wafer holding plate is prevented.

Figure 3:
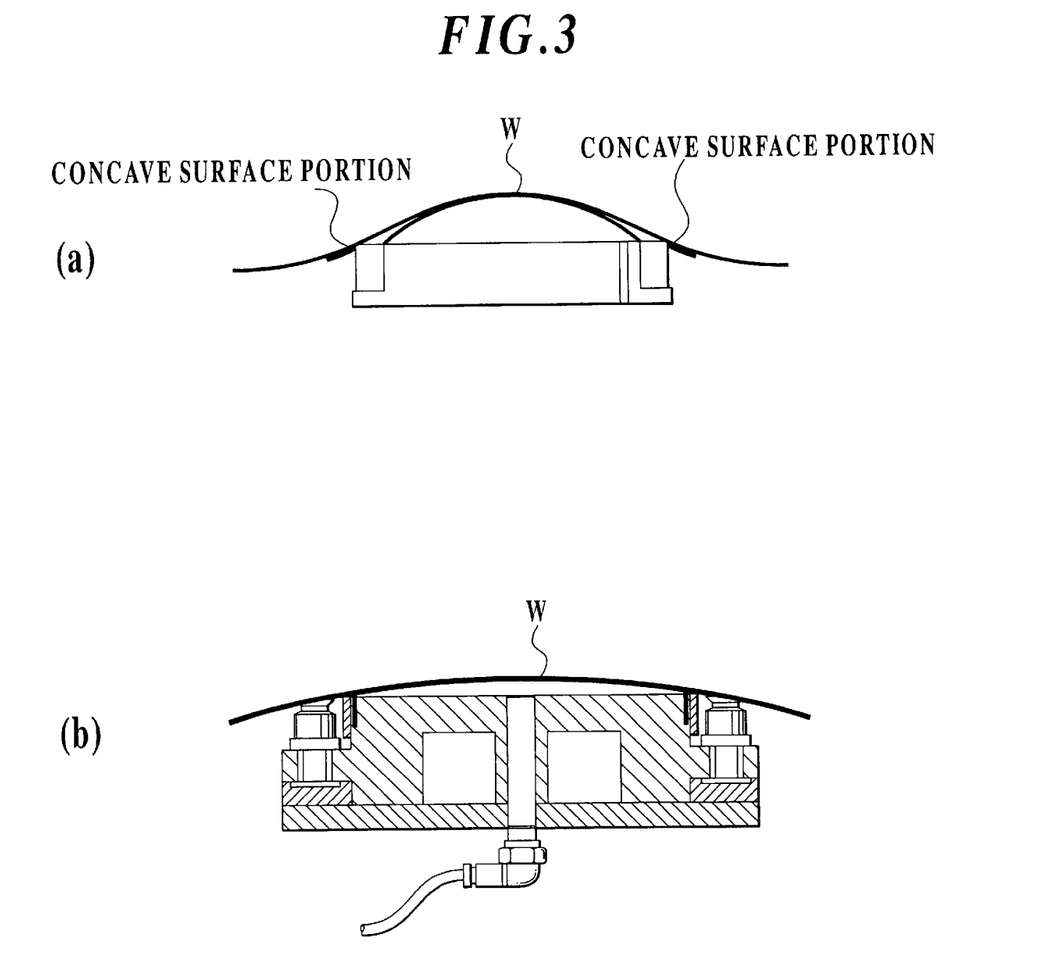
FIG. 3 are views for comparing a shape of the surface to be adhered of the wafer in the present invention with that in an example of the earlier developed technique.

That is, when the shape of the surface to be adhered of the wafer W chucked to be held on the wafer adhering apparatus 10 of the first embodiment is compared with the shape of the surface to be adhered of the wafer W chucked to be held on the wafer adhering apparatus of the earlier developed technique, the surface to be adhered of the wafer W on the wafer adhering apparatus of the earlier developed technique has the concave surface portion as shown in FIG. 3(a). On the other hand, with the wafer adhering apparatus of the first embodiment as shown FIG. 3(b), the surface to be adhered of the wafer W swells so as to form the convex surface as a whole, and the surface to be adhered of the wafer W does not have the concave surface portion. As a result, remaining of the trace amount of air between the surface to be adhered of the wafer W and the wafer holding plate is prevented.

Figure 4:
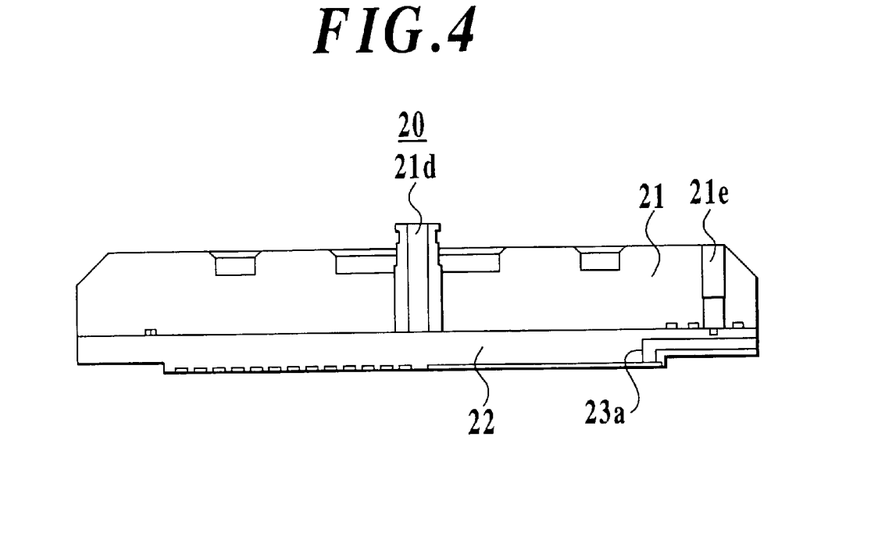
FIG. 4 is a schematic structural view of a wafer adhering apparatus according to the second embodiment of the present invention.
Figure 5:
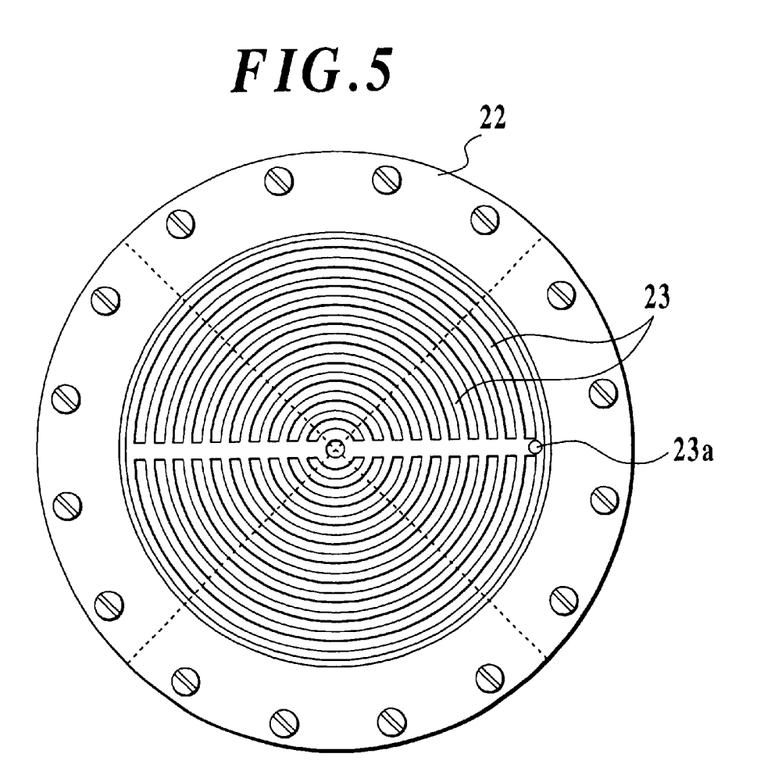
FIG. 5 is a view showing a contacting member of the wafer adhering apparatus according to the second embodiment.

FIG. 4 and FIG. 5 show the wafer adhering apparatus according to the second embodiment of the present invention. A contacting member 22 is attached to a wafer holding surface (a surface which is in a lower side in an adhering condition) of a wafer holding member 21 of the wafer adhering apparatus 20 of the second embodiment.

The contacting member 22 comprises, for example, a ceramic plate. Preferably, it comprises a ceramic plate made of zirconia material. In the case of ceramic, the high pressure air is used for expanding the contacting member 22, thus the shape of the wafer holding surface can be finely controlled. Particularly, the zirconia material is suitable therefor, because it has high flexural strength and small Young's modulus, compared with the other ceramic material (alumina material).

The attachment of the contacting member 22 to the wafer holding member 21 is carried out by screwing peripheral portions of the contacting member 22 on the wafer holding member 21. The wafer holding member 21 is provided with an air supply and discharge hole 21d. The air supply and discharge hole 21d is communicated with an air supply and discharge apparatus (for example, a pump) which is not shown. The contacting member 22 is expanded or contracted by supplying air to a space between the wafer holding member 21 and the contacting member 22 or by discharging the air from the space through the air supply and discharge hole 21d. The contacting member 22 is provided with concentric circular grooves 23. The concentric circular grooves 23 are interrupted halfway and partly, and then communicated with one another. The contacting member 22 is provided with an air supply and discharge hole 23a communicating with the grooves 23. The wafer holding member 21 is provided with an air passage 21e communicating with the air supply and discharge hole 23a. The air passage 21e is independently communicated with an air supply and discharge apparatus.

Other structures are much the same as in the first embodiment, thus the detailed explanation for them is omitted.

According to the wafer adhering apparatus 20, the grooves 23 for vacuum-chucking the surface to be polished of the wafer W are formed in the wafer holding surface of the contacting member 22, so that it is possible to make the contacting area between the contacting member 22 and the wafer W large. Therefore, during expansion of the contacting member 22, the wafer W can be more efficiently curved to a desired shape along the wafer holding surface.

The contacting member 22 may be made of silicon rubber, other polymeric materials or metallic materials in place of the ceramic. When the contacting member 22 is made of metallic material, it is preferable that the wafer holding surface is coated with nonmetallic material in order to prevent the metal contamination of the wafer.

Figure 6:
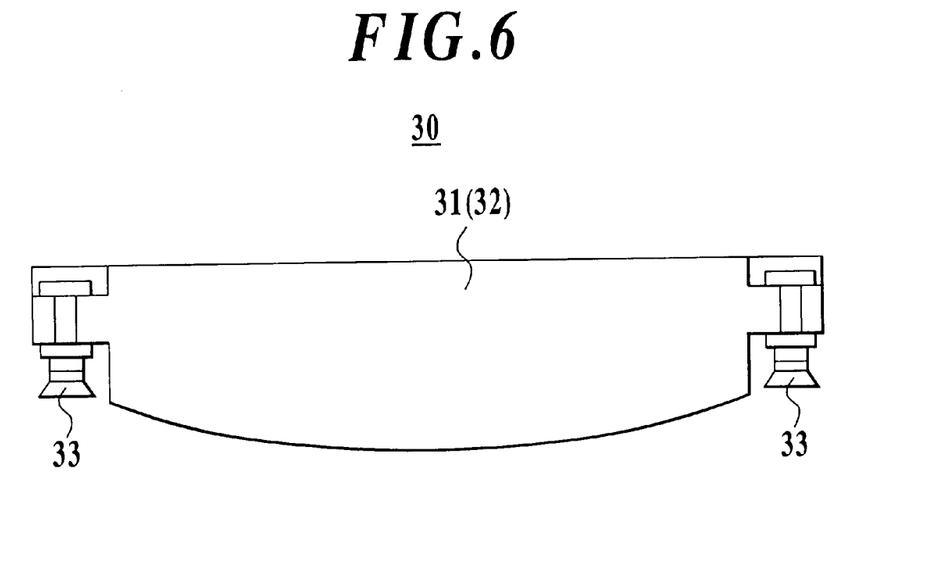
FIG. 6 is a schematic structural view of a wafer adhering apparatus according to the third embodiment of the present invention.

FIG. 6 shows the wafer adhering apparatus according to the third embodiment of the present invention. A wafer holding member 31 of the wafer adhering apparatus 30 of the third embodiment constitutes a contacting member 32 at the same time, and a lower surface (a surface which is in a lower side in an adhering condition) thereof is formed into a convex surface. It is preferable that a wafer contacting region of a wafer holding surface which has a convex surface-like swell is made such that a value of radius of curvature of a line of intersection between a plane including a normal line of an arbitrary point and passing through a center of the wafer contacting region and the wafer contacting region is between 5 m and 1000 m within a region which surrounds the center of the wafer contacting region and which is at least not less than 50% of the entire adhesion area of the wafer. When the value of radius of curvature falls in such range and the wafer has a diameter of 200 mm or 300 mm, the difference of elevation of the surface to be adhered of the wafer W can be between 20 $\mu$m and 1000 $\mu$m. The wafer holding member 31 may be made of metal, ceramic, hard rubber, or plastic (polymeric material). However, when it is made of metal, since a problem of the metal contamination of the wafer W may arise according to the material, it is preferable in this case that a surface of the contacting member 32, which is brought into contact with the wafer W is coated with resin or the like, or made of other nonmetallic material. The periphery of the contacting member 32 is provided with a plurality of chucking pads 33 which are the same as in the first embodiment. The wafer is chucked to be held in the peripheral edge portions.

In addition to this, the surface of the contacting member 32 may be provided with a small hole or grooves for discharging air. The wafer may be chucked to be held by vacuum-sucking the wafer W through the small hole or grooves.

Other structures are much the same as in the first embodiment, thus the detailed explanation for them is omitted.

According to the wafer adhering apparatus 30, the surface to be polished of the wafer W is vacuum-chucked by the plurality of chucking pads 33, and the surface to be adhered of the wafer W is forced to curve by the contacting member 32 so that it will have the convex surface during the vacuum-chucking of the surface to be polished. As a result, no concave surface portion generates on the surface to be adhered of the wafer W.

Figure 7:
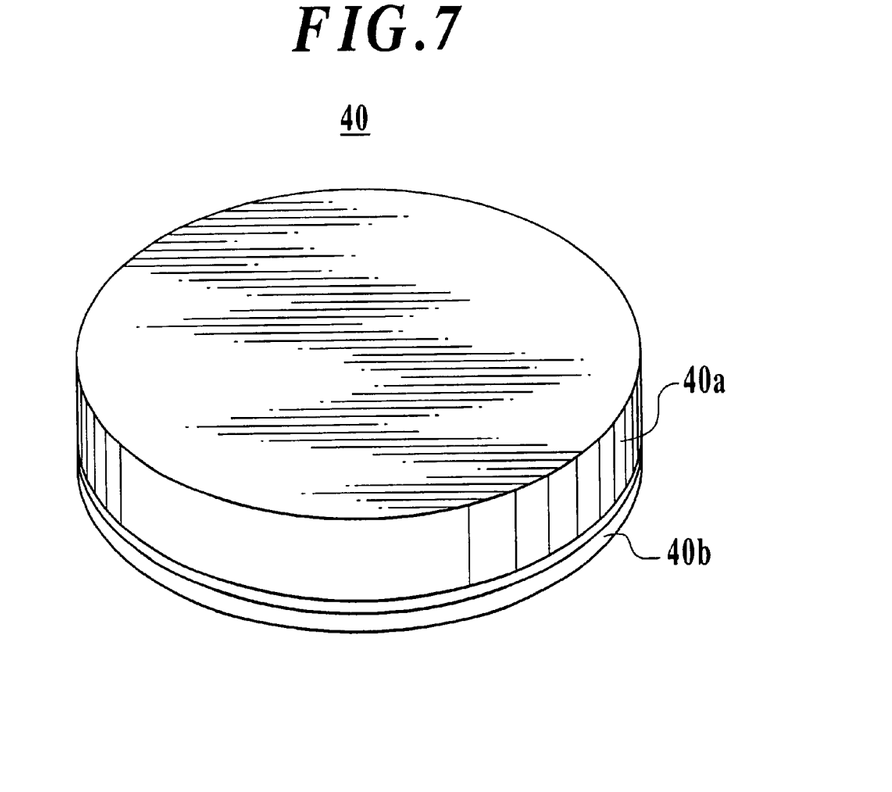
FIG. 7 is a perspective view of a wafer holding plate according to the fourth embodiment of the present invention.

FIG. 7 shows the wafer holding plate according to the fourth embodiment of the present invention. The structure of the wafer holding plate 40 according to the fourth embodiment will be explained. The wafer holding plate 40 comprises, as shown in the figure, a base member of a ceramic plate 40a having a diameter of 630 mm and a thickness of 20 mm, which are not particularly limited to, and a glass plate 40b having a diameter of 630 mm and a thickness of 1 mm to 20 mm, which are not particularly limited to. The wafer W is adhered to a surface of the latter glass plate 40b, the surface being not bonded with the ceramic plate 40a.

With the thickness of the glass plate 40b, while it is preferable that the entirety thereof is made as thin as possible for preventing the deformation and keeping the coefficient of thermal conductivity excellent, a certain degree of thickness is required from the handling side of the glass plate 40b during the adhesion with the ceramic base member. In view of these points, the above-described range of the thickness is determined.

The ceramic plate 40a of the wafer holding plate 40 constructed as above-described is hard to bend because it has high rigidity compared with the glass plate 40b. As described above, having two-body structure, the wafer holding plate 40 has both advantages of rigidity of ceramic and excellent adhesion property against the wafer W. Thus, the flatness in the polishing can be improved.

In order to verify the effect, using a wafer holding plate comprising a ceramic plate having a diameter of 630 mm and a thickness of 20 mm, to which a glass plate having a diameter of 630 mm and a thickness of 5 mm is adhered, a p-type semiconductor silicon wafer having a diameter of 200 mm was adhered to the wafer holding plate with wax, and then polished. The evaluation therefor was carried out.

Explaining the polishing conditions in this case, a polishing stock removal was 10 $\mu$m, abrasive grains of A colloidal silica as abrasive slurry was used, and unwoven cloth made of urethane was employed for a polishing pad. For 140 pieces of wafers, the polishing was carried out under the same condition.

As a result, in the entire surface of the semiconductor silicon wafer, the same degree of flatness (TTV (GBIR)$\leq$1.0 $\mu$m, LTVmax (SBIRmax)$\leq$0.4 $\mu$m, SFQR$\leq$0.25 $\mu$m) as in the case that the ceramic plate was used as the wafer holding plate was obtained, and there was no occurrence of bright spot. Further, only the thickness of the glass plate was changed to 2 mm, 10 mm, 15 mm, or 20 mm, each glass plate was adhered to the ceramic plate, and the polishing was carried out such that other conditions were the same. Then, the same effect was obtained. Although the experiment with the one exceeding 20 mm was not carried out, it is expected that the effect is reduced because the larger the thickness of the glass plate becomes, the lower the coefficient of thermal conductivity of the surface to be adhered of the wafer W becomes.

With the wafer holding plate in the fourth embodiment, although the glass plate is fixed with adhesive to the ceramic plate, the wafer holding plate may be provided with a glass layer formed by deposition or the like on the ceramic plate at an adhesion side for the wafer W. In the case of forming it by the deposition or the like, it is preferable that the glass layer has a thickness of 0.05 mm to 2 mm. In case of glass layer, the problem of handling like in the glass plate is not arisen. However, since the formation of the glass layer requires long time, this point is considered.

Figure 8:
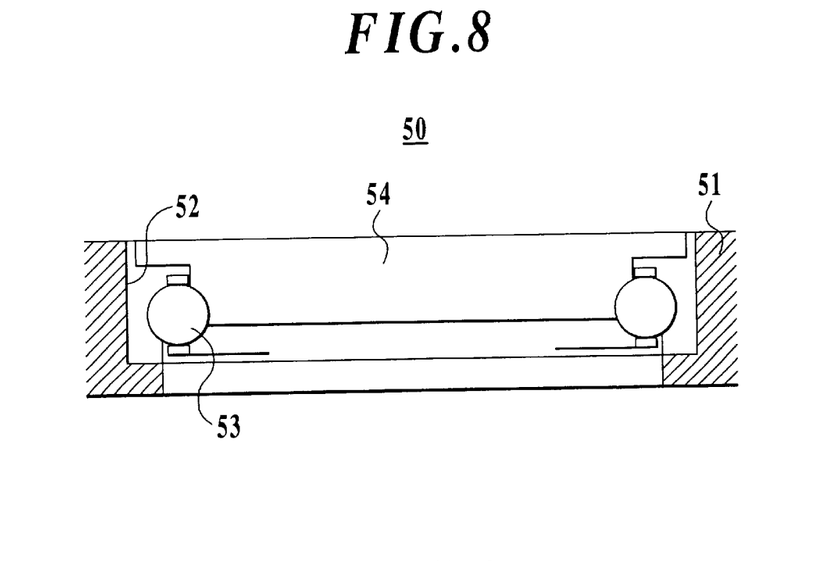
FIG. 8 is a partial sectional view of a wafer holding plate according to the fifth embodiment of the present invention.

FIG. 8 shows the wafer holding plate according to the fifth embodiment of the present invention. The wafer holding plate 50 of the fifth embodiment is the batch processing wafer holding plate where a plurality of wafers are mounted with adhesive on the wafer holding plate and polished at the same time. However, only a portion thereof is shown in the figure. A base member 51 of the wafer holding plate 50 is made of ceramic. In the base member 51, a concave portion 52 is formed in each place for holding the wafer. Radial bearings 53 are disposed in each concave portion 52, and a wafer holding portion 54 is attached detachably to each concave portion 52. Each wafer holding portion 54 in this case is also made of ceramic.

In the wafer holding plate 50, the wafer is adhered to the wafer holding portion 54 which is in a detached condition.

According to the wafer holding plate 50 constructed as described above, since the wafer holding portion 54 is held turnably onto the base member 51 through the radial bearings 53, the wafer holding portion 54 rotates inductively during the polishing of the wafer W adhered to the wafer holding portion 54. Thus, the polished surface of the wafer W becomes flatter.

With the wafer holding plate 50, the wafer holding portion 54 is made of ceramic. However, if a base member thereof is made of ceramic and a holding surface thereof is provided with a glass plate or a glass layer, it is more suitable for improving the flatness of the wafer, because the glass surface has an excellent adhesion property for the wafer. It is not necessary for the wafer holding portion 54 to be detachable and attachable to the base member 51.

Figure 9:
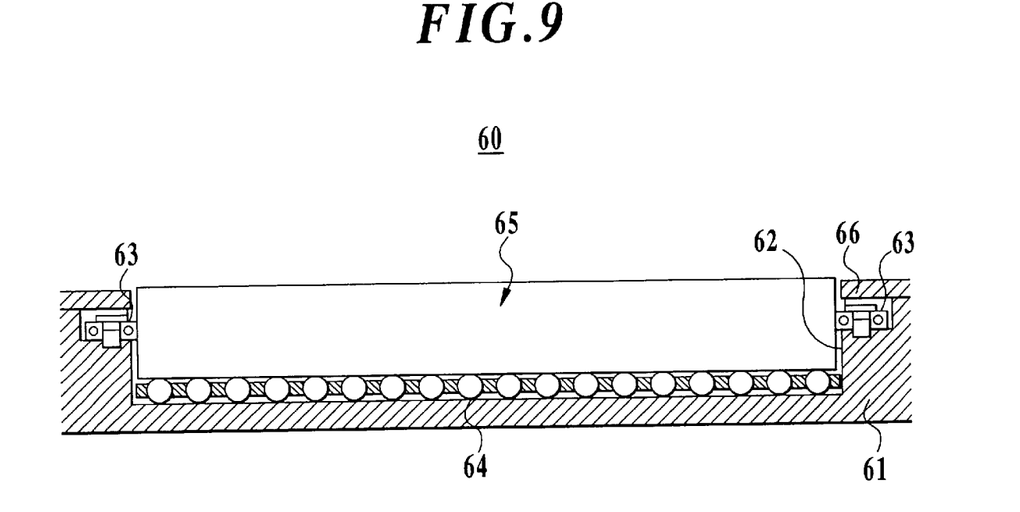
FIG. 9 is a partial sectional view of a wafer holding plate according to the sixth embodiment of the present invention.

FIG. 9 shows the wafer holding plate according to the sixth embodiment of the present invention. The wafer holding plate 60 of the sixth embodiment is the batch processing wafer holding plate, however, only a portion thereof is shown in the figure. A base member 61 of the wafer holding plate 60 is made of ceramic. In the base member 61, a concave portion 62 is formed in each place for holding the wafer W. Radial bearings 63 and a thrust bearing 64 are disposed in each concave portion 62, and a wafer holding portion 65 is attached detachably to each concave portion 62. A ball of the thrust bearing 64 is made of ceramic. Each wafer holding portion 65 is also made of ceramic. In the figure, a reference numeral 66 denotes a holding plate of the radial bearing 63.

Similarly, in the wafer holding plate 60, the wafer is adhered to the wafer holding portion 65 which is in a detached condition.

According to the wafer holding plate 60 constructed as described above, since the wafer holding portion 65 is held turnably onto the base member 61 through the radial bearings 63 and the thrust bearing 64, the wafer holding portion 65 rotates inductively during the polishing of the wafer W adhered to the wafer holding portion 65. Thus, the polished surface of the wafer W becomes flatter.

With the wafer holding plate 60, the wafer holding portion 65 is made of ceramic. However, if a base member thereof is made of ceramic and a holding surface thereof is provided with a glass plate or a glass layer, it is more suitable for improving the flatness of the wafer, because the glass surface has an excellent adhesion property for the wafer. It is not necessary for the wafer holding portion 65 to be detachable and attachable to the base member 61.

Figure 10:
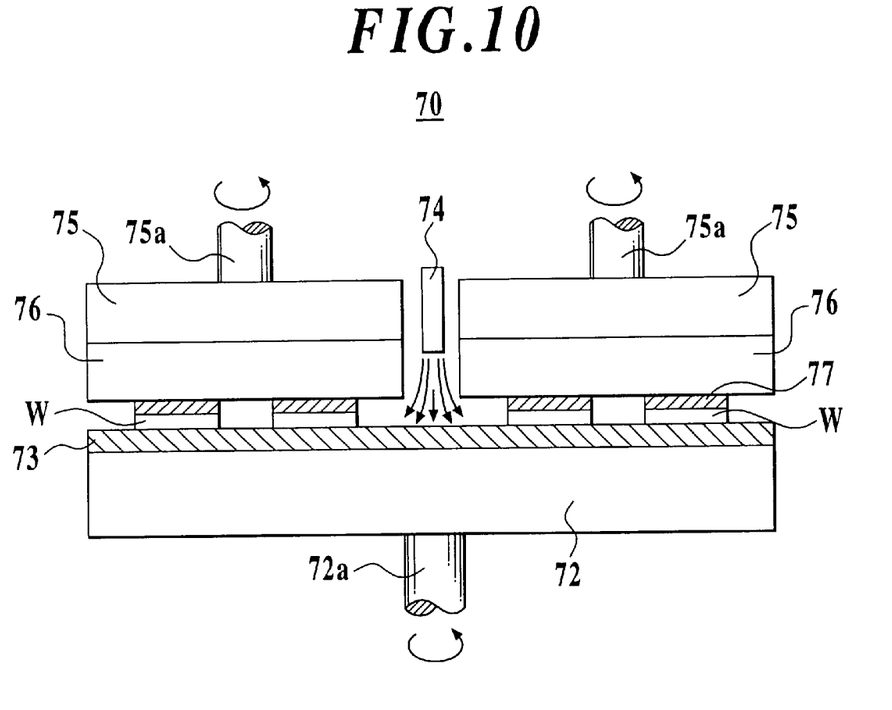
FIG. 10 is a structural view of a polishing apparatus according to the seventh embodiment of the present invention.

FIG. 10 shows a polishing apparatus according to the seventh embodiment of the present invention. The polishing apparatus 70 of the seventh embodiment has a polishing turn table 72. The polishing turn table 72 Is driven to rotate on a shaft 72a by a motor which is not shown. A polishing pad 73 is disposed to stretch on the polishing turn table 72. The polishing pad 73 in this case is not particularly limited to, but made of nonwoven cloth. A plurality of top rings 75 are disposed above the polishing turn table 72, which is not particularly limited to. These top rings 75 are rotatable on its shafts 75a. The top rings 75 are movable up and down by elevating means (for example, a cylinder device) which is not shown.

It is possible to install a wafer holding plate 76 as described in any one of the fourth to the sixth embodiments, under the top ring 75. Wafers W are adhered to the wafer holding plates 76 by the method and the apparatus described in any one of the first to the third embodiments. In the figure, a reference numeral 77 denotes wax. When the wafer holding plate 76 is set under the top ring 75, it is set so that the wafers W adhered will be in a lower side.

Furthermore, a slurry nozzle 74 is located above the central portion of the polishing turn table 72. The slurry nozzle 74 is connected with a slurry supplying device (not shown). The abrasive slurry is appropriately supplied to the slurry nozzle 74 from the slurry supplying device. As the abrasive slurry in this case, alkaline solution including abrasive grains of colloidal silica is supplied, which is not particularly limited to.

With the polishing apparatus 70, in the condition as shown in FIG. 10, the polishing turn table 72 is rotated by the motor which is not shown, and the abrasive slurry is supplied from the slurry nozzle 74. In this case, when the polishing turn table 72 is rotated, the wafer holding portion or the wafer holding plate 76, and furthermore the top rings 75 are also rotated inductively with the polishing turn table 72. Thereby, the wafer W is rubbed against the polishing pad 73, and thus the polishing of the wafer W is carried out.

As described above, the embodiments of the present invention are explained, however, needless to say, the present invention is not limited to the embodiments and examples, and various modifications may be made within the scope of the invention. For example, the present invention can be applied to a polishing of other thin plate products, such as magnetic disc substrates, quartz glass substrates or the like.

It goes without saying that the first to the seventh embodiments can be used by combining with one another, if possible.

Industrial Applicability

According to the present invention, the flatness of the polished wafer can be improved. Therefore, the method for polishing a wafer and the apparatus for polishing a wafer, and furthermore the wafer holding plate, the wafer adhering method and the wafer adhering apparatus which are used for the method and apparatus for polishing a wafer according to the present invention suit particularly the polishing of thin plate products, such as semiconductor wafers, such as silicon wafers or the like, magnetic disc substrates, quartz glass substrates or the like.

What is claimed is:

1. A wafer adhering method for adhering a wafer to a wafer holding plate in order to polish a surface to be polished of the wafer by pressing and rubbing the surface to be polished against a polishing pad on a polishing turn table, the method comprising the steps of:

holding the wafer by vacuum-chucking the surface to be polished of the wafer such that a surface to be adhered of the wafer forms a convex surface in a vicinity including an arbitrary point in the surface to be adhered within a region surrounding a center of the surface to be adhered of the wafer, and the region being at least not less than 50% of an entire adhesion area; and adhering the wafer to the wafer holding plate from a central portion of the surface to be adhered of the wafer.

2. The wafer adhering method as claimed in claim 1, wherein the wafer is held by vacuum-chucking by curving the wafer such that a value of radius of curvature of a line of intersection between a plane including a normal line of an arbitrary point in the surface to be adhered and passing through a center of the surface to be adhered and the surface to be adhered is between 5 m and 1000 m, within a region which surrounds the center of the surface to be adhered and which is at least not more than 50%.

3. A wafer adhering apparatus comprising a vacuum chuck that holds a surface to be polished of a wafer such that a surface to be adhered of the wafer forms a convex surface in a vicinity including an arbitrary point in the surface to be adhered within a region surrounding a center of the surface to be adhered of the water, the region being at least not less than 50% of an entire adhesion area.

4. The wafer adhering apparatus as claimed in claim 3, comprising a contacting member being brought into contact with the surface to be polished of the wafer, wherein a wafer contacting region of a wafer holding surface of the contacting member forms a convex surface in a vicinity including an arbitrary point on the wafer contacting region, within a region surrounding a center of the wafer contacting region and corresponding to at least not less than 50% of an entire adhesion area of the wafer.

5. The wafer adhering apparatus as claimed in claim 4, wherein the contacting member being brought into contact with the surface to be polished of the wafer is capable of transforming by a pressure applying means such that the surface to be adhered wafer forms a convex surface.

6. The wafer adhering apparatus as claimed in claim 5, wherein the pressure applying means comprises an air supply and discharge apparatus.

7. The wafer adhering apparatus as claimed in claim 4, wherein the contacting member which is brought into contact with the surface to be polished of the wafer is provided with a small hole for discharging air in order to hold the wafer by vacuum-chucking.

8. The wafer adhering apparatus as claimed in claim 4, wherein a groove is formed in the wafer holding surface of the contacting member which is brought into contact with the surface to be polished of the wafer, and the wafer is held by vacuum-chucking through the groove.

9. The wafer adhering apparatus as claimed in claim 4, wherein the contacting member which is brought into contact with the surface to be polished of the wafer is made of ceramic.

10. The wafer adhering apparatus as claimed in claim 4, wherein the contacting member which is brought into contact with the surface to be polished of the war is made of polymeric material.

11. The wafer adhering apparatus as claimed in claim 4, wherein the contacting member which is brought into contact with the surface to be polished of the wafer is made of metallic material, and at least the wafer holding surface of the contacting member is coated with nonmetallic material.

12. The wafer adhering apparatus as claimed in claim 3, comprising a contacting member being brought into contact with the surface to be polished of the wafer, wherein a wafer contacting region of a wafer holding surface of the contacting member has a value of radius of curvature between 5 m and 1000 m, the radius of curvature being for a line of intersection between a plane which includes a normal line of an arbitrary point in the wafer contacting region and which passes through a center of the wafer contacting region and the wafer contacting region, within a region surrounding the center of the wafer contacting region and corresponding to at least not less than 50% of an entire adhesion area of the wafer.

13. The wafer adhering apparatus as claimed in claim 3, wherein the wafer is held by vacuum-chucking only in a peripheral portion of the surface to be polished of the wafer.

14. The wafer adhering apparatus as claimed in claim 13, wherein the wafer is held by vacuum-chucking with a plurality of holders having a sucking disk structure.

15. A wafer holding plate comprising:

a base member made of ceramic; and a surface for adhering a wafer, the surface comprising a glass layer, wherein the glass comprises borosilicate glass.

16. The wafer holding plate as claimed in claim 15, wherein the glass layer has a thickness between 0.05 mm and 2 mm.

17. A wafer holding plate comprising:

a base member made of ceramic; and a glass plate being provided on a side for adhering a wafer of the base member, wherein the glass comprises borosilicate glass.

18. The wafer holding plate as claimed in claim 17, wherein the glass plate has a thickness between 1 mm and 20 mm.

19. A wafer adhering method comprising the step of adhering a wafer to a wafer holding plate by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area.

20. The wafer adhering method as claimed in claim 19, comprising the step of adhering the wafer while holding the wafer such that difference of elevation of the surface to be adhered of the wafer is between 20 $\mu$m and 1000 $\mu$m.

21. A wafer adhering method comprising the step of adhering a wafer to a wafer holding plate comprising a base member made of ceramic and a glass plate provided on a side for adhering a wafer, of the base member, by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area.

22. The wafer adhering method as claimed in claim 21, comprising the step of adhering the wafer while holding the wafer such that difference of elevation of the surface to be adhered of the wafer is between 20 µm and 1000 µm.

23. A wafer adhering method comprising the step of adhering a wafer to a wafer holding plate used for a batch processing polishing apparatus, the wafer holding plate comprising a wafer holding portion being turnable with respect to a base body, by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area.

24. The wafer adhering method as claimed in claim 23, comprising the step of adhering the wafer while holding the wafer such that difference of elevation of the surface to be adhered of the wafer is between 20 µm and 1000 µm.

25. A method for polishing a wafer by polishing a surface to be polished of the wafer by pressing and rubbing the surface to be polished against a polishing pad on a polishing turn table, the method comprising the steps of:
holding the wafer by vacuum-chucking the surface to be polished of the wafer such that a surface to be adhered of the wafer forms a convex surface in a vicinity including an arbitrary point in the surface to be adhered within a region surrounding a center of the surface to be adhered of the wafer, and the region being at least not less than 50% of an entire adhesion area;
adhering the wafer to a wafer holding plate from a central portion of the surface to be adhered of the wafer; and
polishing the wafer.

26. A method for polishing a wafer, comprising the steps of:
adhering a wafer to a wafer holding plate by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area; and
polishing the wafer.

27. A method for polishing a wafer, comprising the steps of:
adhering a wafer to a wafer holding plate comprising: a base member made of ceramic; and a glass plate provided on a side for adhering a wafer, of the base member, by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area; and
polishing the wafer.

28. A method for polishing a wafer, comprising the steps of:
adhering a wafer to a wafer holding plate used for a batch processing polishing apparatus, the wafer holding plate comprising a wafer holding portion being turnable with respect to a base body, by using a wafer adhering apparatus in which the wafer is held by vacuum-chucking a surface to be polished of the wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area; and
polishing the wafer.

29. A wafer processing apparatus, comprising:
a vacuum chuck that holds a surface to be polished of a wafer such that a surface to be adhered of the wafer forms a convex surface in a vicinity including an arbitrary point in the surface to be adhered within a region surrounding a center of the surface to be adhered of the wafer, the region being at least not less than 50% of an entire adhesion area;
in combination with one of:
a wafer holding plate comprising a base member made of ceramic and a surface for adhering a wafer, the surface comprising a glass layer;
a wafer holding plate comprising a base member made of ceramic and a glass plate being provided on the side for adhering a wafer, of the base member; and
a wafer holding plate used for batch processing polishing apparatus comprising a wafer holding portion being turnable with respect to a base body.

* * * * *